(12) United States Patent
Yamaoka et al.

(10) Patent No.: US 11,139,782 B2
(45) Date of Patent: Oct. 5, 2021

(54) AMPLIFICATION APPARATUS AND TRANSMISSION APPARATUS

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventors: Atsushi Yamaoka, Yokohama (JP); Keiichi Yamaguchi, Kawasaki (JP); Yuuki Funahashi, Fuchu (JP)

(73) Assignees: KABUSHIKI KAISHA TOSHIBA, Minato-ku (JP); TOSHIBA INFRASTRUCTURE SYSTEMS & SOLUTIONS CIRPORATION, Kawasaki (JP)

( * ) Notice: Subject to any disclaimer, the term of this patent is extended or adjusted under 35 U.S.C. 154(b) by 77 days.

(21) Appl. No.: 16/563,651

(22) Filed: Sep. 6, 2019

(65) Prior Publication Data
US 2020/0295711 A1 Sep. 17, 2020

(30) Foreign Application Priority Data
Mar. 13, 2019 (JP) .............................. JP2019-046218

(51) Int. Cl.
H03F 1/02 (2006.01)
H03F 3/21 (2006.01)
(Continued)

(52) U.S. Cl.
CPC ............. *H03F 1/0211* (2013.01); *H03C 1/00* (2013.01); *H03F 3/211* (2013.01); *H03F 3/72* (2013.01); *H03H 7/0161* (2013.01); *H04L 27/04* (2013.01)

(58) Field of Classification Search
CPC .......... H03F 1/0211; H03F 3/211; H03F 3/72; H03F 2200/451; H03F 3/19;
(Continued)

(56) References Cited

U.S. PATENT DOCUMENTS 8,115,540 B2   2/2012   Nose et al.
8,773,045 B1 * 7/2014   Cheng .................... H05B 47/10
                                                                315/307
(Continued)

FOREIGN PATENT DOCUMENTS

JP   2007-258768 A   10/2007
JP   5267127 B2        8/2013
(Continued)

*Primary Examiner* — Hieu P Nguyen
(74) *Attorney, Agent, or Firm* — Oblon, McClelland, Maier & Neustadt, L.L.P.

(57) ABSTRACT

An amplification apparatus as the embodiment of the present invention includes a switching amplifier and an adjuster. The switching amplifier is driven on the basis of a control signal and amplifies an input signal to be amplified to generate an amplified signal. The adjuster adjusts at least one of the signal to be amplified and the control signal before being input into the switching amplifier. In addition, the adjuster adjusts so that timing when the control signal turns from LOW to HIGH aligns with timing when the signal to be amplified turns from LOW to HIGH, or aligns with timing when the signal to be amplified turns from HIGH to LOW.

15 Claims, 15 Drawing Sheets

(51) Int. Cl.
*H03F 3/72* (2006.01)
*H04L 27/04* (2006.01)
*H03H 7/01* (2006.01)
*H03C 1/00* (2006.01)

(58) Field of Classification Search
CPC ..... H03F 3/2173; H03F 3/245; H03H 7/0161; H04L 27/04; H03C 1/00
USPC ........................................ 330/251, 207 A, 10
See application file for complete search history.

(56) References Cited

U.S. PATENT DOCUMENTS 9,490,758 B2 11/2016 Okada
9,590,829 B2 3/2017 Egashira et al.
10,122,390 B2 11/2018 Egashira et al.

FOREIGN PATENT DOCUMENTS

| JP | 2016-144012 A | 8/2016 |
| JP | 2017-147606 A | 8/2017 |
| WO | WO 2008/032782 A1 | 3/2008 |
| WO | WO 2014/103265 A1 | 7/2014 |

* cited by examiner

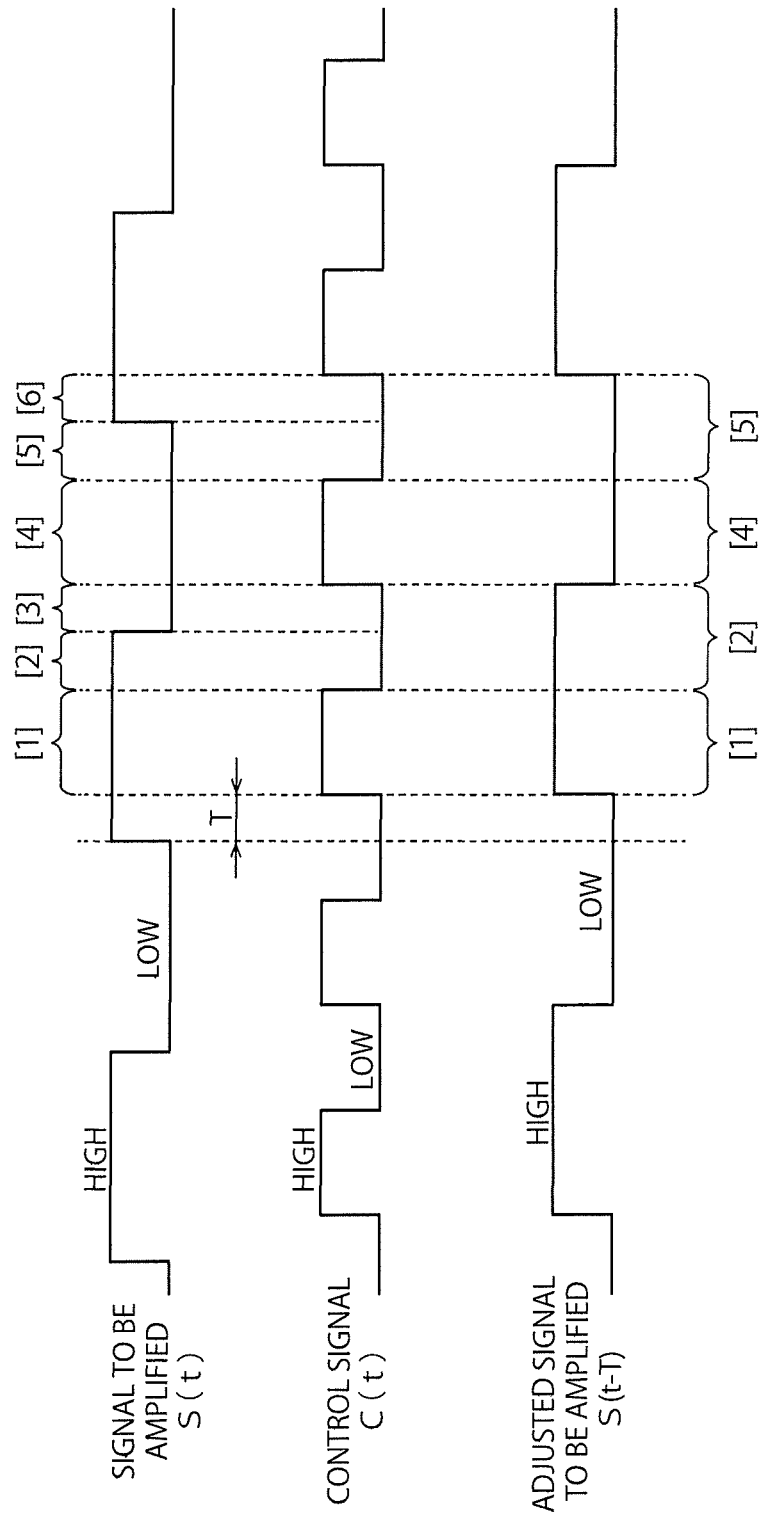

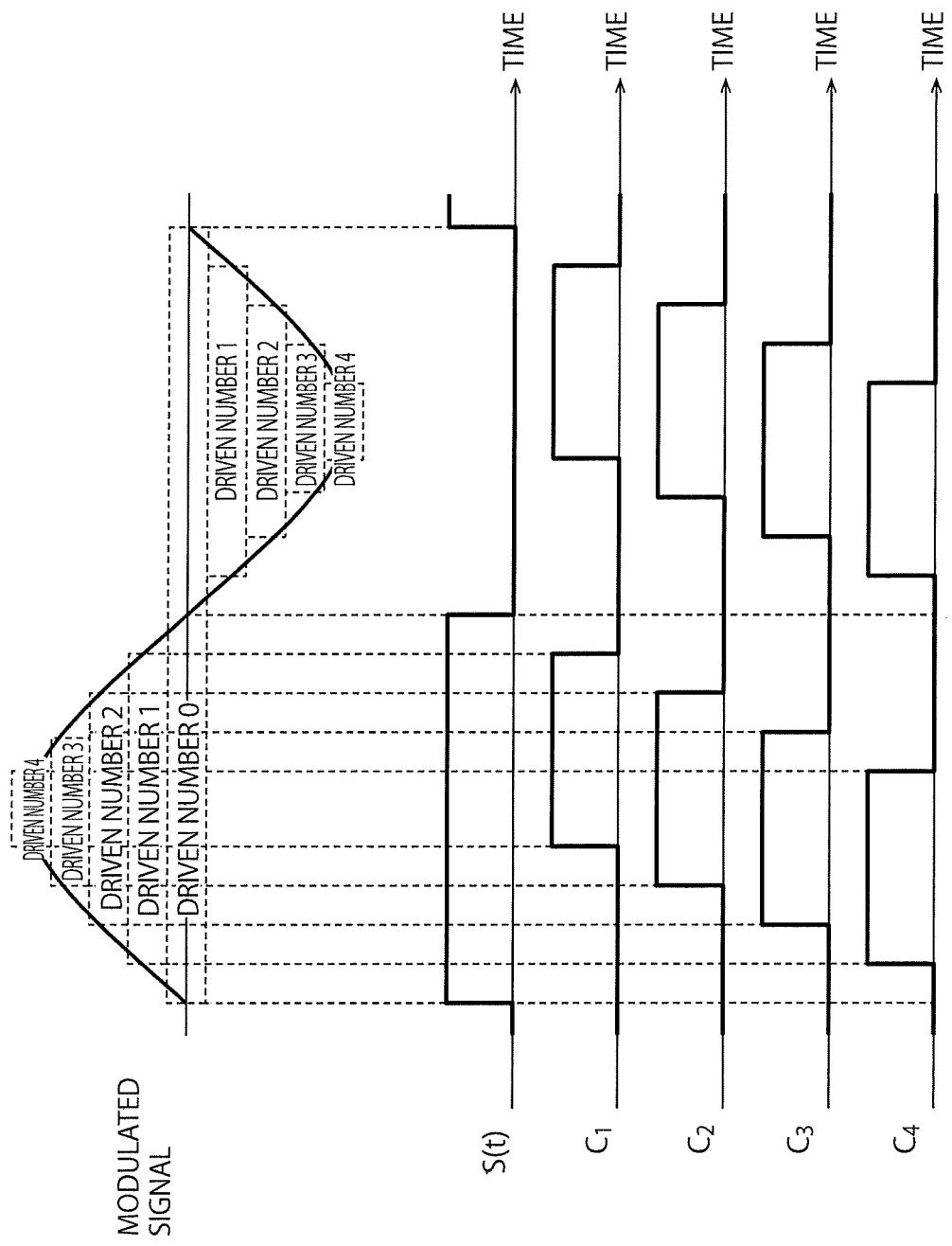

AMPLIFICATION APPARATUS AND TRANSMISSION APPARATUS

CROSS-REFERENCE TO RELATED APPLICATION (S)

This application is based upon and claims the benefit of priority from Japanese Patent Application No. 2019-046218, filed Mar. 13, 2019; the entire contents of which are incorporated herein by reference.

FIELD

Embodiments described herein relate generally to an amplification apparatus and a transmission apparatus.

BACKGROUND

Switching amplifiers used for amplification of rectangular signals are used in various apparatuses. For example, there is known an apparatus that performs modulation by changing the number of driven switching amplifiers according to the amplitude level of a signal and combining signals output from the switching amplifiers. Because output signals from switching amplifiers include harmonic components, a filter such as a band-pass filter (BPF) is used in general. In the apparatus that performs the above-described modulation, however, the waveform of an output signal is a step shape, so the apparatus has an advantage of being able to suppress harmonics without using a filter.

As just described, it is very important to control the switching amplifiers. However, there is a case where the switching amplifiers are not controlled as expected. Therefore, there is a risk that the reliability of an apparatus using the switching amplifiers may be impaired.

BRIEF DESCRIPTION OF THE DRAWINGS

FIG. 4 illustrates adjustment by an adjuster;

FIG. 11 illustrates another example of the control signal.

DETAILED DESCRIPTION

An embodiment of the present invention provides an amplification apparatus that uses a switching amplifier and is higher in reliability than before.

An amplification apparatus as the embodiment of the present invention includes a switching amplifier and an adjuster. The switching amplifier is driven on the basis of a control signal and amplifies an input signal to be amplified to generate an amplified signal. The adjuster adjusts at least one of the signal to be amplified and the control signal before being input into the switching amplifier. In addition, the adjuster adjusts so that timing when the control signal turns from LOW to HIGH aligns with timing when the signal to be amplified turns from LOW to HIGH, or aligns with timing when the signal to be amplified turns from HIGH to LOW.

Below, a description is given of embodiments of the present invention with reference to the drawings. The present invention is not limited to the embodiments.

First Embodiment

Figure 1:
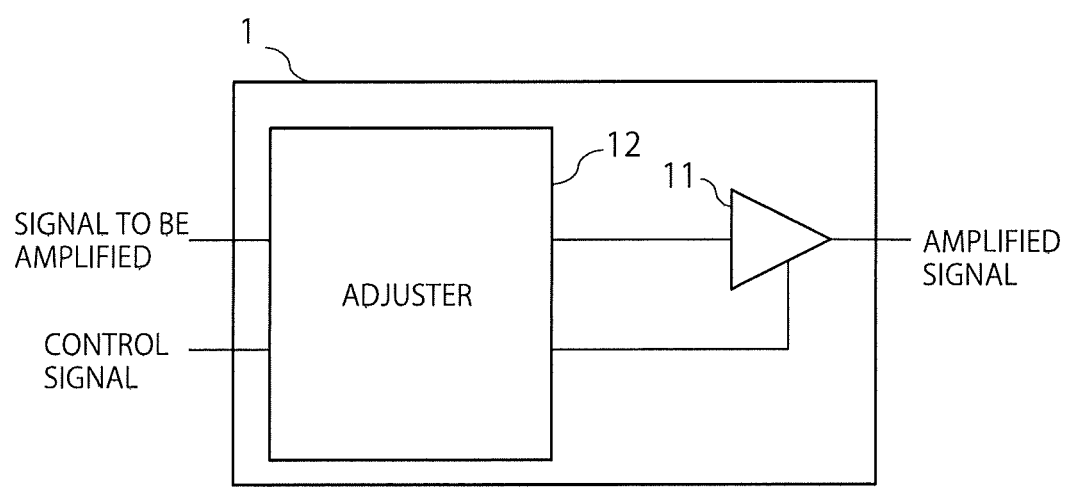
FIG. 1 is a block diagram illustrating an example of an amplification apparatus according to a first embodiment.

FIG. 1 is a block diagram illustrating an example of an amplification apparatus 1 according to a first embodiment. The amplification apparatus 1 according to the embodiment includes a switching amplifier 11 and an adjuster 12.

The amplification apparatus 1 of the embodiment is an apparatus that amplifies a rectangular signal which will be amplified and input into the amplification apparatus 1. Hereinafter, the signal which will be amplified is referred to as "signal to be amplified" and a signal which is already amplified is referred to as "amplified signal." For example, it may be supposed that a transmission apparatus configured to transmit an AM broadcast or the like includes the amplification apparatus 1 in order to perform amplitude modulation. In that case, a carrier signal with its waveform processed into a rectangle corresponds to the signal to be amplified.

During driving, the switching amplifier 11 amplifies an input signal to be amplified to generate an amplified signal. Incidentally, there may be a case where the switching amplifier 11 is not driven. For example, in the case where there are a plurality of amplification apparatuses 1, some of them may perform amplification and the rest may not perform amplification. Whether to perform amplification is determined on the basis of a control signal input into the switching amplifier 11. That is, the control signal controls driving (on/off) of the switching amplifier 11 and the switching amplifier 11 is driven on the basis of the control signal.

In the description, it is assumed that the control signal is represented by a binary value of 0 or 1. Then, when the value of the control signal is 1, it is assumed that the switching amplifier 11 is turned on and the amplified signal is output. When the value of the control signal is 0, it is assumed that the switching amplifier 11 is turned off and there is no output, in other words, 0 V is output.

In the embodiment, it is assumed that the control signal is generated by an apparatus external to the amplification apparatus 1, and input into the amplification apparatus 1. It is also assumed that the control signal is generated so as to have a half cycle of a cycle of the signal to be amplified. A value of duty ratio of the control signal may be freely selected.

Figure 2:
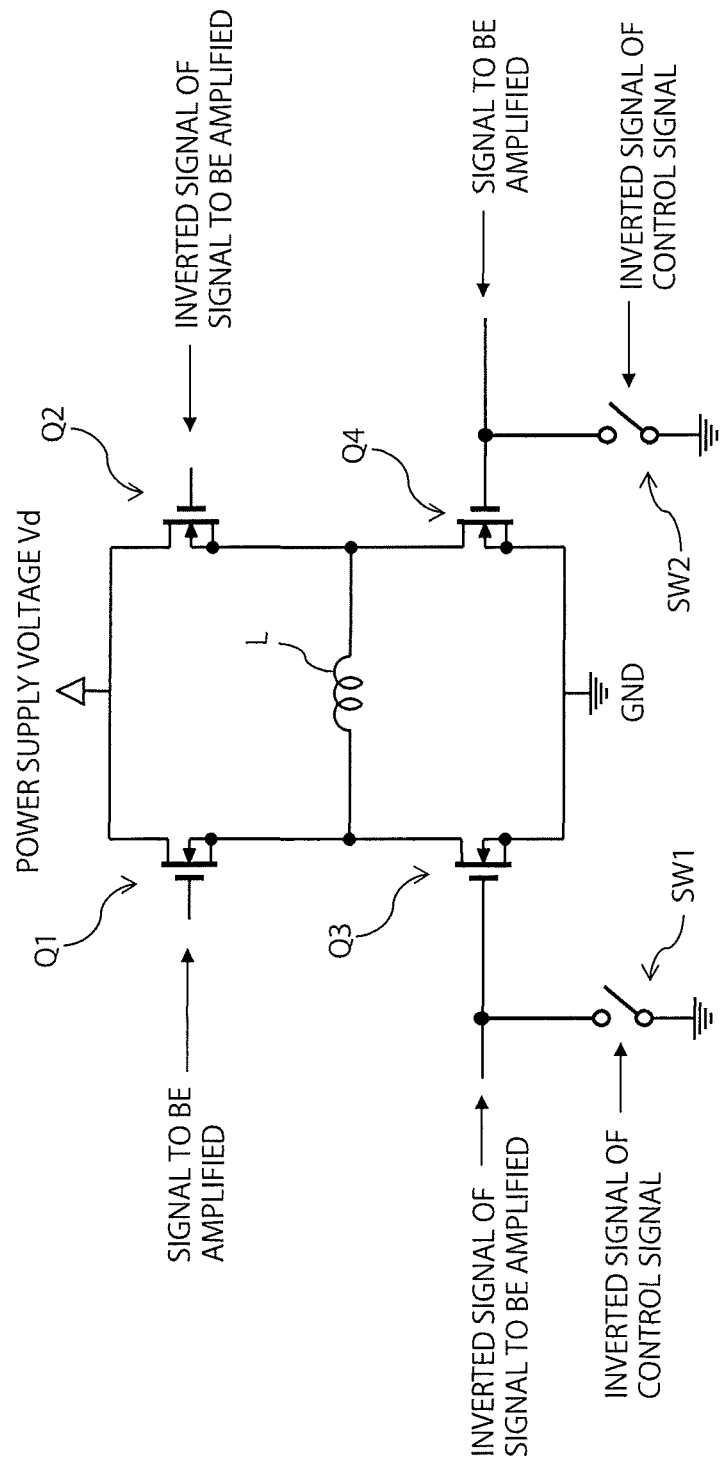
FIG. 2 illustrates an example of a configuration of a switching amplifier.

Details of operation of the switching amplifier 11 will be described. FIG. 2 illustrates an example of a configuration of the switching amplifier 11. FIG. 2 illustrates an example in which the switching amplifier 11 includes a full bridge circuit. The full bridge circuit is that four transistors operating as switches are formed in a full bridge configuration. Here, the four transistors are referred to as a first transistor Q1, a second transistor Q2, a third transistor Q3, and a fourth transistor Q4. Specifically, the first transistor Q1 and the second transistor Q2 are connected in parallel, and the third transistor Q3 and the fourth transistor Q4 are also connected in parallel. In addition, the first transistor Q1 and the third transistor Q3 are connected in series, and the second transistor Q2 and the fourth transistor Q4 are also connected in series.

A power supply voltage Vd is applied to a connection point between the first transistor Q1 and the second transistor Q2, and a connection point between the third transistor Q3 and the fourth transistor Q4 is connected to a ground (GND). The first transistor Q1 and the second transistor Q2 on the power supply voltage side are also referred to as first high-side transistor and second high-side transistor, respectively. The third transistor Q3 and the fourth transistor Q4 on the GND side are also referred to as first low-side transistor and second low-side transistor, respectively.

In the example of FIG. 2, one transformer L is built into the bridge circuit. It is assumed that an amplified voltage is output via the transformer L. One end of the transformer L is connected to a connection point between the first transistor Q1 and the third transistor Q3. On the other hand, the other end of the transformer L is connected to a connection point between the second transistor Q2 and the fourth transistor Q4. In the example of FIG. 2, the power supply voltage is applied to the transformer L and thereby amplification is performed. That is, the transistors are each controlled so that potential difference occurs between both ends of the transformer L when the control signal is 1, and potential difference does not occur between both ends of the transformer L when the control signal is 0. Here, it is defined that the potential difference of the transformer L is positive if a potential ($V_{13}$) of the connection point between the first transistor Q1 and the third transistor Q3 is higher than a potential ($V_{24}$) of the connection point between the second transistor Q2 and the fourth transistor Q4, and it is defined that the potential difference is negative if the potential ($V_{13}$) is lower than the potential (V24).

Each transistor is controlled based on at least one of the signal to be amplified and the control signal. In the example of FIG. 2, the first transistor Q1 switches according to the input signal to be amplified. The second transistor Q2 receives an inverted signal of the signal to be amplified and switches according to the inverted signal. The third transistor Q3 switches according to the inverted signal of the signal to be amplified and an inverted signal of the control signal. In the example of FIG. 2, the inverted signal of the signal to be amplified is input into an input line of the third transistor Q3, and the input line is connected to a first switch SW1 that switches according to the inverted signal of the control signal. This allows the third transistor Q3 to switch according to the inverted signal of the signal to be amplified and the inverted signal of the control signal. The fourth transistor Q4 switches according to the signal to be amplified and the inverted signal of the control signal. In the example of FIG. 2, the signal to be amplified is input into an input line of the fourth transistor Q4, and the input line is connected to a second switch SW2 that switches according to the inverted signal of the control signal. This allows the fourth transistor Q4 to switch according to the signal to be amplified and the inverted signal of the control signal.

Each transistor turns on when a value of an input signal is equal to or more than a threshold value, and turns off when it is less than the threshold value. Since the signal (signal to be amplified or its inverted signal) input into each transistor has a rectangular wave, each transistor turns on when the signal is a maximum (HIGH) and turns off when it is a minimum (LOW). In addition, it is assumed that each switch turns on when a value of an input signal is 1 (that is, when the control signal is 0) and turns off when it is 0 (that is, when the control signal is 1).

In the case of a configuration like FIG. 2, when the control signal is 0, each switch turns on and current flows to the GND, so each low-side transistor does not turn on. Hence, it is an ideal operation is that the potential difference between both ends of the transformer L becomes 0 and voltage occurring on a secondary side also becomes 0. In this way, the full bridge circuit of FIG. 2 is configured to be driven on the basis of the signal to be amplified and the control signal.

Depending on the configuration of the switching amplifier 11, however, even if the control signal is 0, there is a case where a return current flows. For example, there is a case where a return current diode is provided in order to prevent an instantaneous high voltage from being applied to the transformer L. In addition, some transistors have an equivalent diode inside. For example, a MOSFET (Metal Oxide Semiconductor Field Effect Transistor) has a diode built in equivalently between a source and a drain because of its structure. Such an equivalent diode is referred to as a body diode. In the MOSFET, although current normally flows from the drain toward the source, there is a case where the return current flows from the source toward the drain via the body diode. Therefore, when the switching amplifier 11 includes a transistor having the body diode, the return current may cause an output different from an expected one to occur.

FIG. 3A-3F illustrate switching operation of the full bridge circuit and its output. In FIG. 3A-3F, a transistor in an OFF-state is indicated by the symbol of a diode. In addition, a transistor in an ON-state is also indicated by the symbol of the diode if current flows via the body diode.

The upper part of FIG. 3A-3F shows waveforms of the signal to be amplified and the control signal. It is assumed that the waveform of the signal to be amplified is represented by a function S(t) indicating the value of the signal to be amplified at time t. It is also assumed that the waveform of the control signal is represented by a function C(t) indicating the value of the control signal at time t. In the examples of FIG. 3, one cycle is divided into six periods from [1] to [6] according to variations of the values of the signal to be amplified and the control signal.

For convenience of description, a combination of the value of the signal to be amplified and the value of the control signal is represented by (the value of the signal to be amplified, the value of the control signal). Because the signal to be amplified has a rectangular wave, it takes two values of HIGH and LOW, but in the following description, HIGH of the signal to be amplified is described as 1 and LOW of that is described as 0. That is, combinations are four types of (1,0), (1,1), (0,0), and (0,1).

Figure 3A:
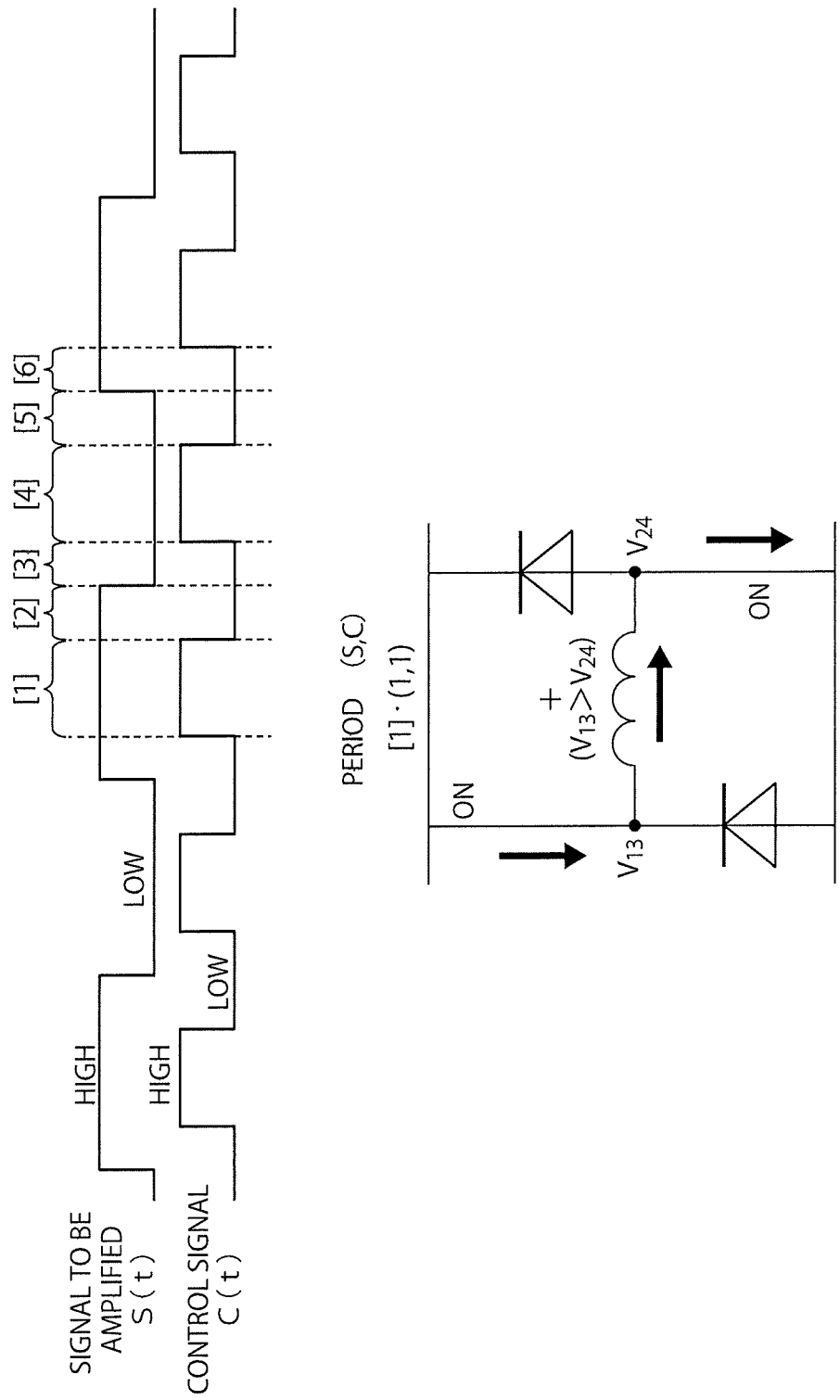
FIG. 3A-3F illustrate switching operation of a full bridge circuit and its output.

FIG. 3A shows the operation of the full bridge circuit during the period of [1] in which the combination is switched from (1,0) to (1,1). In the period of [1], the first transistor Q1 and the fourth transistor Q4 turn on and the second transistor Q2 and the third transistor Q3 turn off. Therefore, the second transistor Q2 and the third transistor Q3 are represented by the symbol of the diode. In the period of [1], a direct current flows from the high side to the low side as indicated by arrows. Here, it is assumed a direction from the connection point between the first transistor Q1 and the second transistor Q2 toward the connection point between the second transistor Q2 and the fourth transistor Q4 is plus and its opposite direction is minus. That is, in the state of the combination (1,1), a plus current flows to the transformer L. In addition, because a potential $V_{13}$ is higher than a potential $V_{24}$ the output power is plus.

Figure 3B:
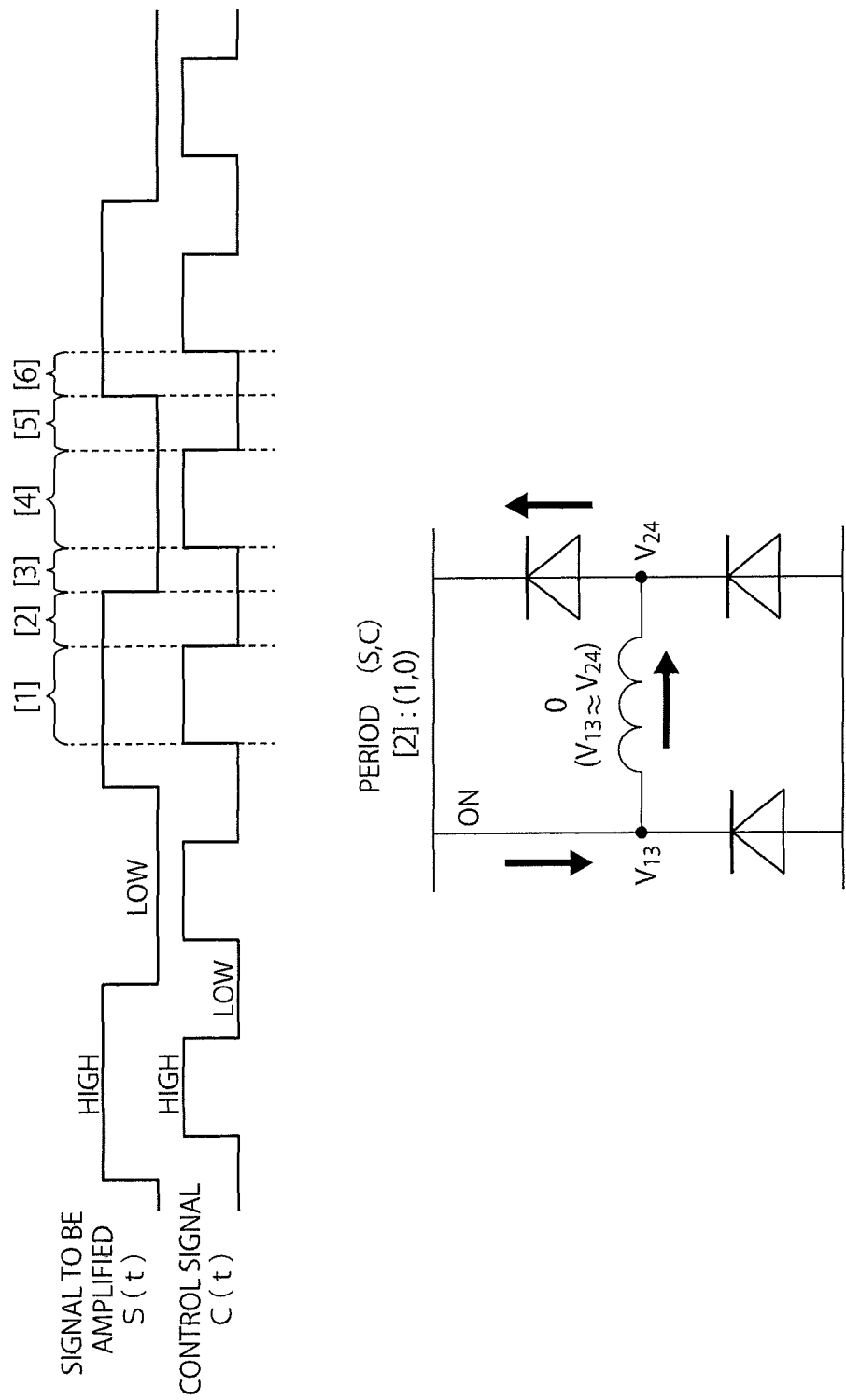

FIG. 3B shows the operation of the full bridge circuit during the period of [2] in which the combination is switched from (1,1) to (1,0). In the period of [2], only the first transistor Q1 turns on and the other transistors turn off. In the period of [2], normally there should be no current path, but the body diode of the second transistor Q2 creates a current path, and current flows as indicated by arrows. The potential difference between both ends of the transformer L is approximately 0 V.

Figure 3C:
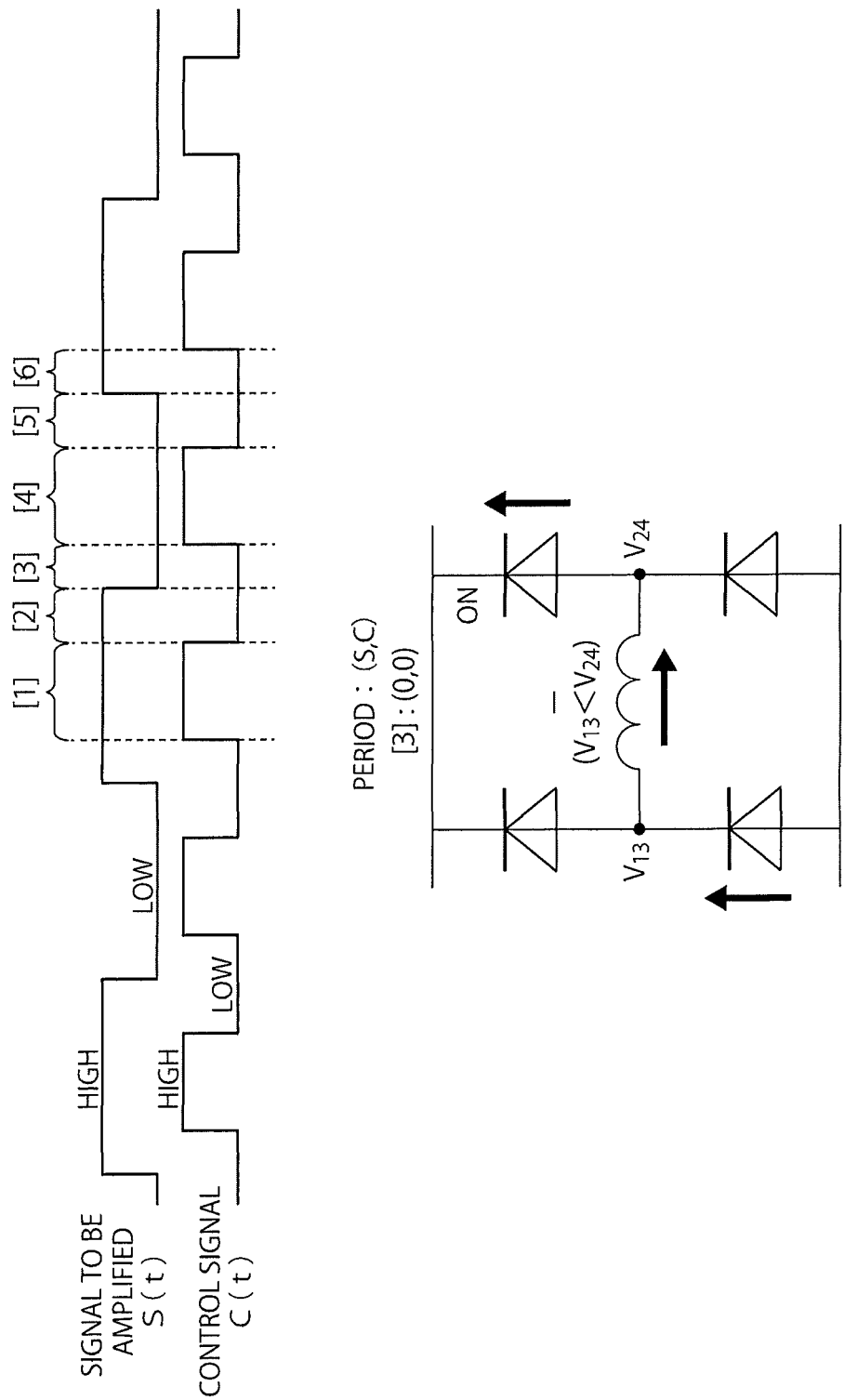

FIG. 3C shows the operation of the full bridge circuit during the period of [3] in which the combination is switched from (1,0) to (0,0). In the period of [3], only the second transistor Q2 turns on and the other transistors turn off. In this case also, normally there should be no current path, but the body diodes of the second transistor Q2 and the third transistor Q3 cause the power supply and the GND to be in conduction state with each other. Since the plus current flew to the transformer L in the state of (1,0) immediately before, the plus current tries to continuously flow to the transformer L by self-induction of the transformer L. Therefore, as shown in FIG. 3C, current flows via the third transistor Q3, the transformer L, and the second transistor Q2, and the current is then absorbed by the power supply. Assuming an ideal state in which the on resistance of the transistor Q is 0Ω, the potential difference across the transformer L becomes −Vd.

Since the control signal is 0, it is preferable under normal circumstances that the potential difference between both ends of the transformer L is 0 V. However, due to the return current flowing through the body diode, an undesired output voltage occurs like this.

Figure 3D:
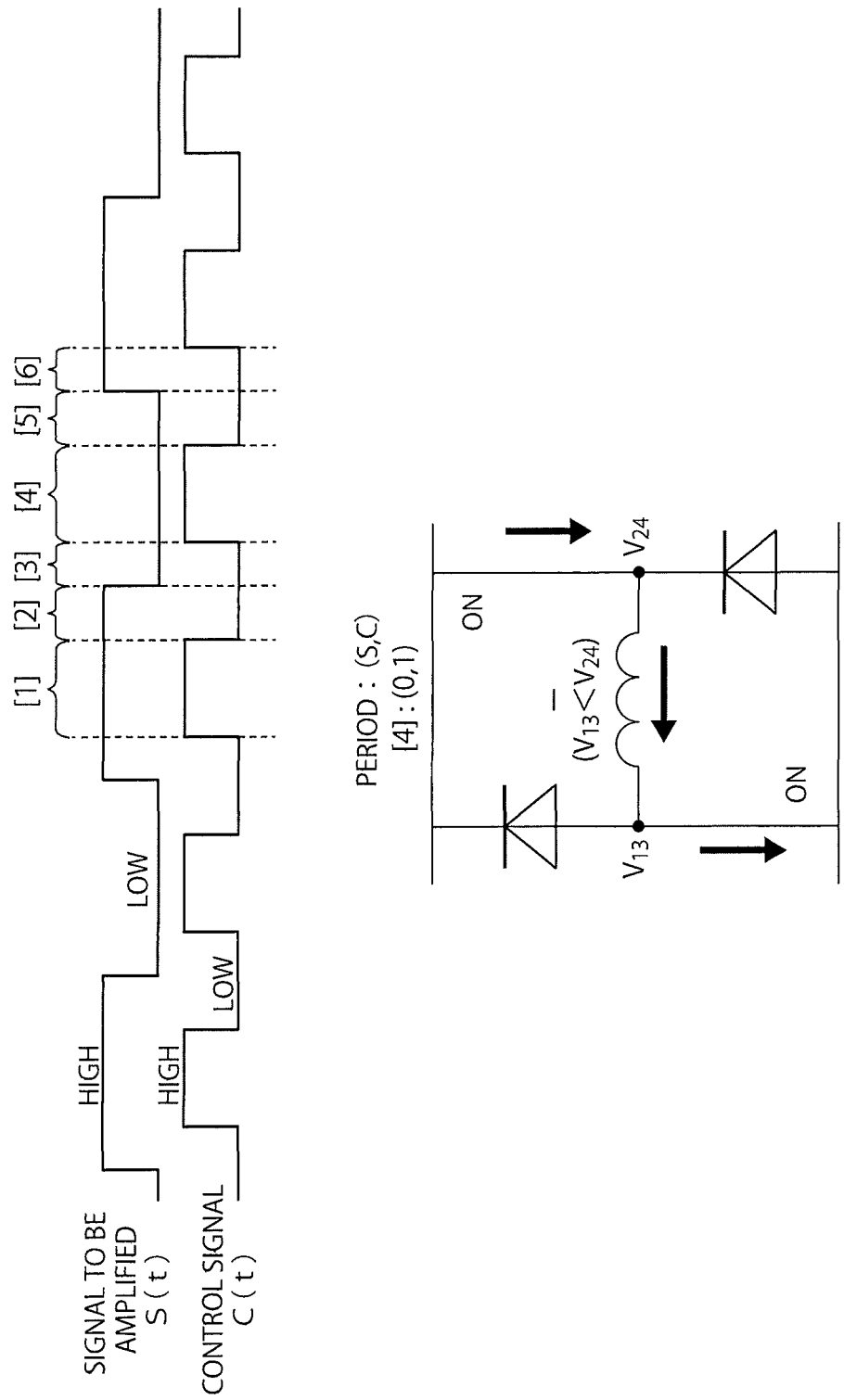

FIG. 3D shows the operation of the full bridge circuit during the period of [4] in which the combination is switched from (0,0) to (0,1). In the period of [4], the second transistor Q2 and the third transistor Q3 turn on and the first transistor Q1 and the fourth transistor Q4 turn off. Therefore, a minus current flows from the high side to the low side. Because the potential $V_{13}$ is lower than the potential $V_{24}$, the output power is minus.

Figure 3E:
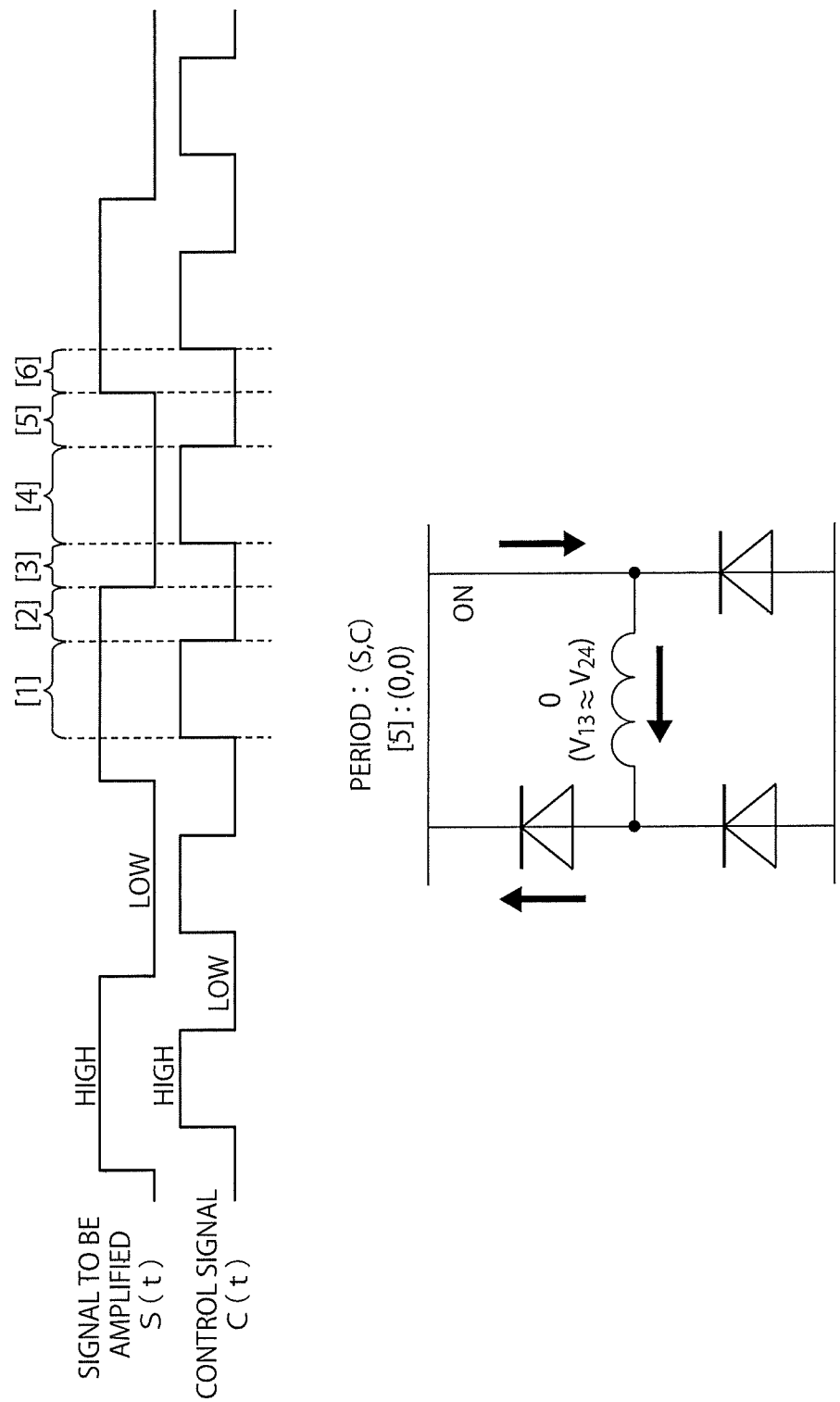

FIG. 3E shows the operation of the full bridge circuit during the period of [5] in which the combination is switched from (0,1) to (0,0). In the period of [5], only the second transistor Q2 turns on and the other transistors turn off. In this case also, normally there should be no current path, but the body diode of the first transistor Q1 creates a current path, and current flows as indicated by arrows by self-induction of the transformer L. The output power is approximately 0 V.

Figure 3F:
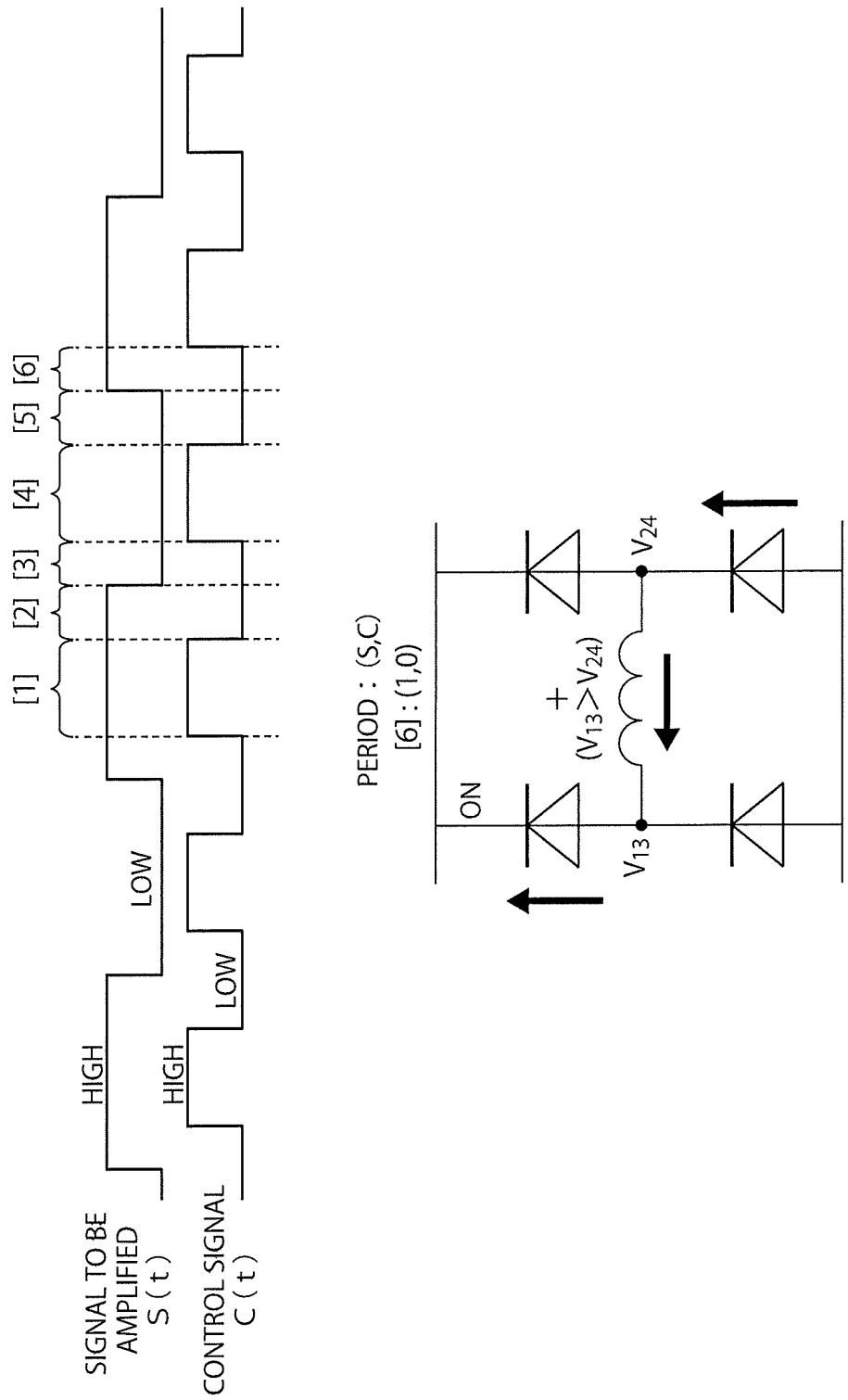

FIG. 3F shows the operation of the full bridge circuit during the period of [6] in which the combination is switched from (0,0) to (1,0). In the period of [6], only the first transistor Q1 turns on and the other transistors turn off. In this case also, normally there should be no current path, but the body diode of the fourth transistor Q4 causes the power supply and the GND to be in conduction state with each other, and current flows as indicated by arrows by self-induction of the transformer L. Because the potential $V_{13}$ is higher than the potential $V_{24}$, the output power is plus.

As described above, during the period of [3] in which the combination is switched from (1,0) to (0,0) and during the period of [6] in which the combination is switched from (0,0) to (1,0), the output voltage does not become 0 and unintended amplification is performed. If the return current occurs like this, the switching amplifier 11 may not operate as expected. Consequently, even if driving of the switching amplifier 11 is controlled in order to obtain an amplified signal with harmonic components suppressed, a situation where an expected effect is not obtained occurs.

The adjuster 12 adjusts at least one of the signals to be amplified and the control signal before it is input into the switching amplifier 11 so that the above-described unintended amplification is not performed by the switching amplifier 11. Specifically, timing of rise of the signal to be amplified and timing of switching of the control signal are adjusted to coincide with each other in order to eliminate the periods of [3] and [6] shown in FIG. 3. Note that switching directions of the signal to be amplified and the control signal may not be the same. That is, timing (rise) when the control signal turns from LOW to HIGH is adjusted so as to align with the timing when the signal to be amplified turns from LOW to HIGH (rise) or align with the timing when the signal to be amplified turns from HIGH to LOW (fall).

It should be noted that the switching timings of the signal to be amplified and the control signal may be regarded as being coincided if a difference between switching timings of the signal to be amplified and the control signal is within an allowable range based on accuracy required of the amplification apparatus 1.

FIG. 4 illustrates adjustment by the adjuster 12. FIG. 4 illustrates the case where the signal to be amplified was adjusted. In addition to the waveforms of the signal to be amplified and the control signal shown in FIG. 3, a waveform of an adjusted signal to be amplified is shown.

The adjusted signal to be amplified can be generated by delaying the signal to be amplified. As shown in FIG. 4, rise of the control signal is delayed by time T with respect to rise of the signal to be amplified S(t). Therefore, the adjuster 12 generates a signal S(t−T) by delaying the signal to be amplified by the time T and inputs it into the switching amplifier 11. This allows the periods of [3] and [6] to be removed as shown in FIG. 4. In this way, by removing the periods when unintended amplification is performed, the unintended amplification due to the return current can be prevented.

Figure 5:
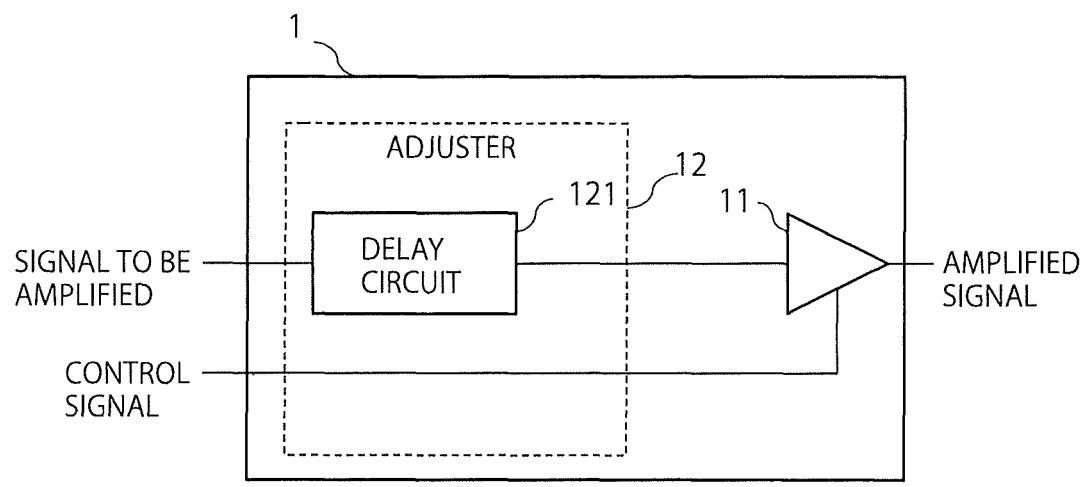
FIG. 5 illustrates an example in which the adjuster includes a delay circuit.

For example, a delay circuit can be used as the adjuster 12. FIG. 5 illustrates an example in which the adjuster 12 includes a delay circuit 121. In FIG. 5, the signal to be amplified is input into the delay circuit 121 since the signal to be amplified is made to be delayed. Note that the control signal may be input into the delay circuit 121 and delayed. An amount of delay between the signal to be amplified and the control signal is confirmed in advance, and an input to the switching amplifier 11 is delayed by the delay amount. This causes the timings of switching of both signals to coincide at the time of input into the switching amplifier 11. Therefore, the delay circuit 121 can be used as the adjuster 12.

Figure 6:
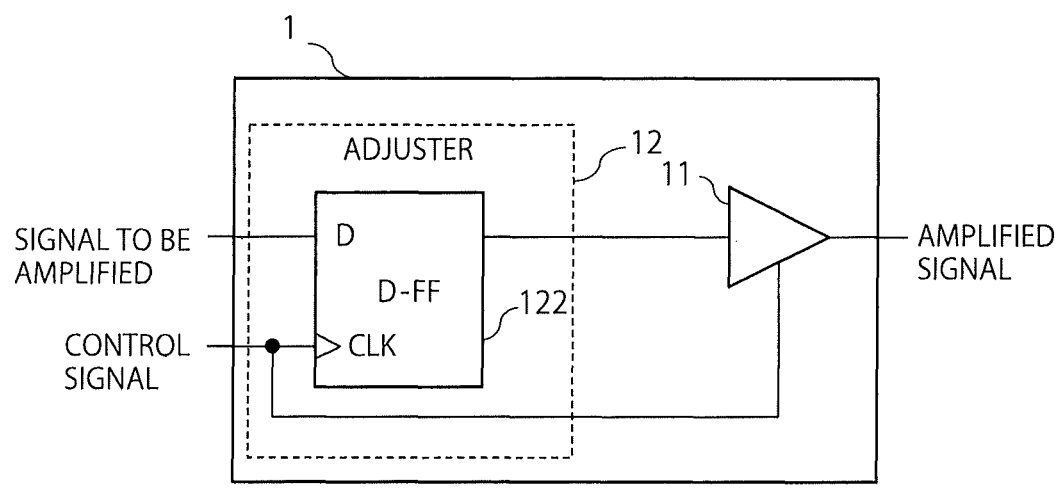
FIG. 6 illustrates an example in which the adjuster includes a D flip-flop.

For example, a D flip-flop (D-FF) may be used as the adjuster 12. FIG. 6 illustrates an example in which the adjuster 12 includes a D flip-flop 122. The D flip-flop 122 has a function to hold the input signal while outputting an input signal to a D terminal at rise of an input signal to a CLK terminal. Therefore, the D flip-flop 122 receives the control signal at the CLK terminal and receives the signal to be amplified at the D terminal. The timing of switching of the output signal from the D flip-flop 122 obtained by this coincides with the timing of rise of the control signal. Although the D flip-flop 122 is one type of the delay circuit 121, it can align the timings of switching of the control signal and the signal to be amplified without special setting even in the case where the timing of rise of the control signal varies for each cycle.

Strictly speaking, the timing of switching of the signal to be amplified and the timing of rise of the control signal should coincide with each other at a time point of being processing by the switching amplifier 11. In other words, it is desirable to align timing of switching of a gate terminal of each transistor inside the switching amplifier 11 with operation timing of each switch connected to each of the low-side transistor. However, even if the timings of switching of the control signal and the signal to be amplified are aligned at the adjuster 12, it is assumed that the timings of the control signal and the signal to be amplified deviate from each other due to circuit delay until they reach the gate terminal of each transistor. Therefore, it is preferable that the adjuster 12 does not adjust so that the timings of switching of the control signal and the signal to be amplified are completely aligned at the time point of adjustment, but rather adjusts so that they are aligned at the time point when processed by the switching amplifier 11. For example, if the signal to be amplified is delayed by time $T_m$ and the control signal is delayed by time $T_c$ until they are processed by the switching amplifier 11 after adjustment by the adjuster 12, the adjuster 12 adjusts such that the signal to be amplified is ahead of the control signal by time $T_m$-$T_c$. By absorbing the delay of the circuit in this way, more accurate amplification can be implemented. The times $T_m$ and $T_c$ may be measured in advance.

As described above, in the amplification apparatus 1 of the embodiment, the adjuster 12 adjusts at least one of the signal to be amplified and the control signal input into the switching amplifier 11 and thereby causes the timing when the signal to be amplified turns from LOW to HIGH or the timing when it turns from HIGH to LOW to coincide with the timing when the control signal turns from LOW to HIGH. This allows unintended amplification to be prevented and an expected amplified signal to be obtained from the switching amplifier 11.

Second Embodiment

In a second embodiment, an example of applying the amplification apparatus 1 of the first embodiment to a transmission apparatus is shown as a utilization example of the amplification apparatus 1 of the first embodiment.

Figure 7:
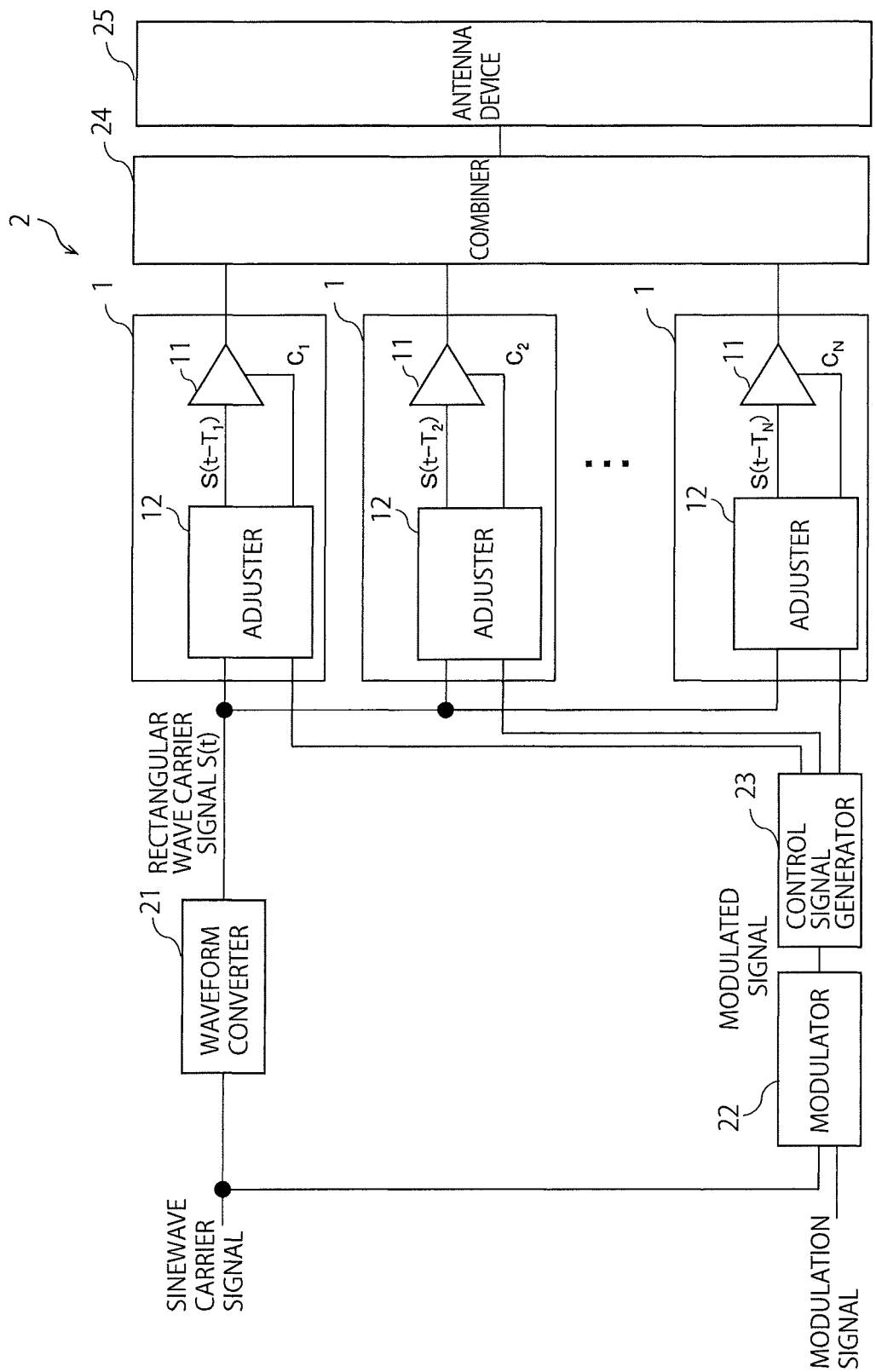
FIG. 7 is a block diagram illustrating an example of a transmission apparatus according to a second embodiment.

FIG. 7 is a block diagram illustrating an example of a transmission apparatus according to the second embodiment. A transmission apparatus 2 according to the embodiment includes a waveform converter 21, a modulator 22, a control signal generator 23, a plurality of amplification apparatuses 1, a combiner 24, and an antenna device 25. The number of amplification apparatuses 1 is not particularly limited, and it is assumed here that there are N amplification apparatuses 1, where N is an integer of two or more.

The transmission apparatus 2 of the embodiment drives the number of amplification apparatuses 1 corresponding to an amplitude level of a signal, such as a voice signal, that will be transmitted (signal to be transmitted) and thereby obtains an amplitude-modulated signal. That is, a necessary number of amplification apparatuses 1 are driven and the others are not driven. Therefore, in the same manner as the first embodiment, each driving of the amplification apparatuses 1 is controlled by a control signal.

Although the example of applying the amplification apparatus 1 to the transmission apparatus 2 that performs processing as described above is shown in order to demonstrate the effectiveness of the amplification apparatus 1, application destinations of the amplification apparatus 1 are not necessarily limited.

The waveform converter 21 performs threshold value determination on the carrier signal, which is a sinewave, and separates the carrier signal into HIGH and LOW. This converts a waveform of the carrier signal into a rectangular wave. The carrier signal which is a sinewave is referred to as sinewave carrier signal, and the carrier signal which is a rectangular wave after conversion as rectangular wave carrier signal. For example, it is considered that a sinewave generated by an oscillator or the like is input into the waveform converter 21 and made into a pulse. Note that a pulse waveform directly generated by an FPGA (Field Programmable Gate Array) or the like may be used as a carrier signal. In that case, the FPGA corresponds to the waveform converter 21, and input of the sinewave carrier signal becomes unnecessary.

The modulator 22 generates a modulated signal by amplitude modulation based on the signal to be transmitted (modulation signal) and the sinewave carrier signal. Modulation means changing a carrier signal according to a modulation signal. In the description, the term "modulated signal" means a signal resulting from modulation of a signal that will be modulated. In other words, the "modulated signal" means a signal after modulation. As an example of the embodiment, the signal that will be modulated is the sinewave carrier signal. The sinewave carrier signal is modulated by the modulation signal, and thereby becomes a modulated signal.

The control signal generator 23 generates a control signal for controlling driving of the amplification apparatus 1 on the basis of the modulated signal. In the example of FIG. 7, in order to drive each amplification apparatus 1 independently of other amplification apparatuses 1, the control signal is generated for each amplification apparatus 1. Here, a control signal for a k-th amplification apparatus 1 is referred to as $C_k$, where k is an integer of two or more and N or less. Note that when several amplification apparatuses 1 are driven together in the same manner, a control signal for the amplification apparatuses 1 driven together may be common. Details of generation of the control signal will be described later.

Each amplification apparatus 1 operates in the same manner as in the first embodiment. In the embodiment, the amplification apparatus 1 receives the corresponding control signal and the rectangular wave carrier signal which is the signal to be amplified, and outputs an amplified signal of the rectangular wave carrier signal if the control signal is 1. Inside each amplification apparatus 1, the timing of rise of the control signal and the timing of switching of the rectangular wave carrier signal are adjusted to coincide with each other. In FIG. 7, the rectangular wave carrier signal is adjusted.

If there are amplification circuits delaying signals by the same amount of time, the adjuster 12 for the amplification circuits may be common. That is, an amplification apparatus 1 including a plurality of switching amplifiers 11 and one adjuster 12 may be used.

Figure 8:
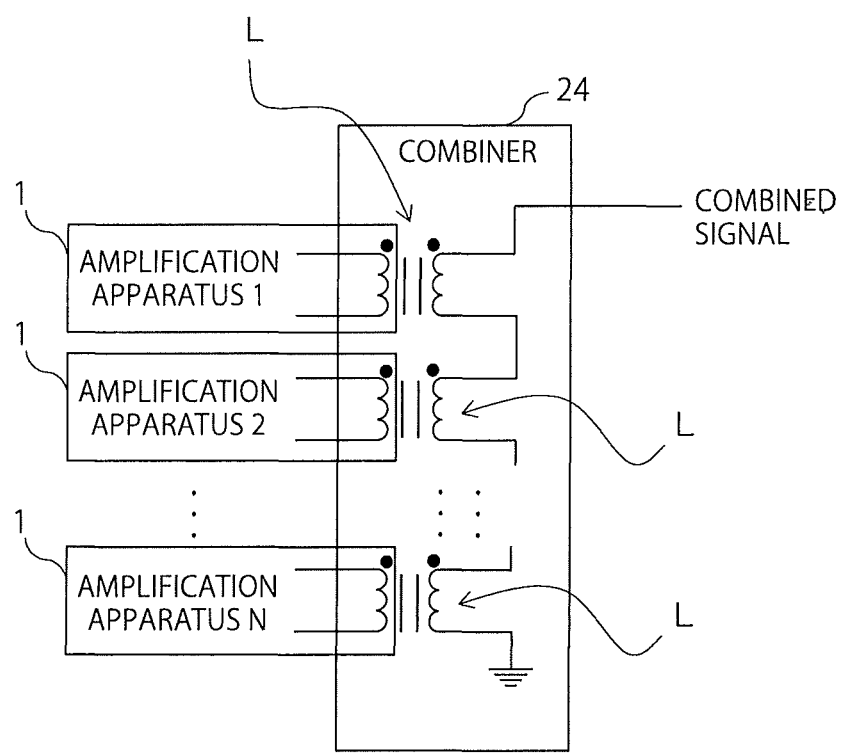
FIG. 8 illustrates an example of a combiner.

The combiner 24 combines amplified signals from the amplification apparatuses 1 to generate a combined signal. FIG. 8 illustrates an example of the combiner 24. In FIG. 8, the combiner 24 is implemented with transformers. The combiner 24 of the example of FIG. 8 includes the number of transformers equal to or more than the number of amplification apparatuses 1 in order to receive output power from each of the amplification apparatuses 1. The transformers of the combiner 24 are connected in series. One end of the whole transformers connected in series is grounded. The other end outputs the combined signal. Due to such a configuration, the amplified signals from the amplification apparatuses 1 are voltage-added and output to the antenna device 25 as the resultant combined signal. Note that the plurality of transformers shown in FIG. 8 may all have the same turn ratio or may have different turn ratios.

The antenna device 25 includes at least an antenna and transmits the combined signal from the combiner 24 by radio wave via the antenna. The antenna device 25 may include its own amplifier, filter, or the like. The antenna device 25 may have any filter although there are filters such as a band-pass filter that passes only a desired signal band, a low-pass filter that passes a desired frequency and below and a bypass filter that passes a desired frequency and above.

Figure 9:
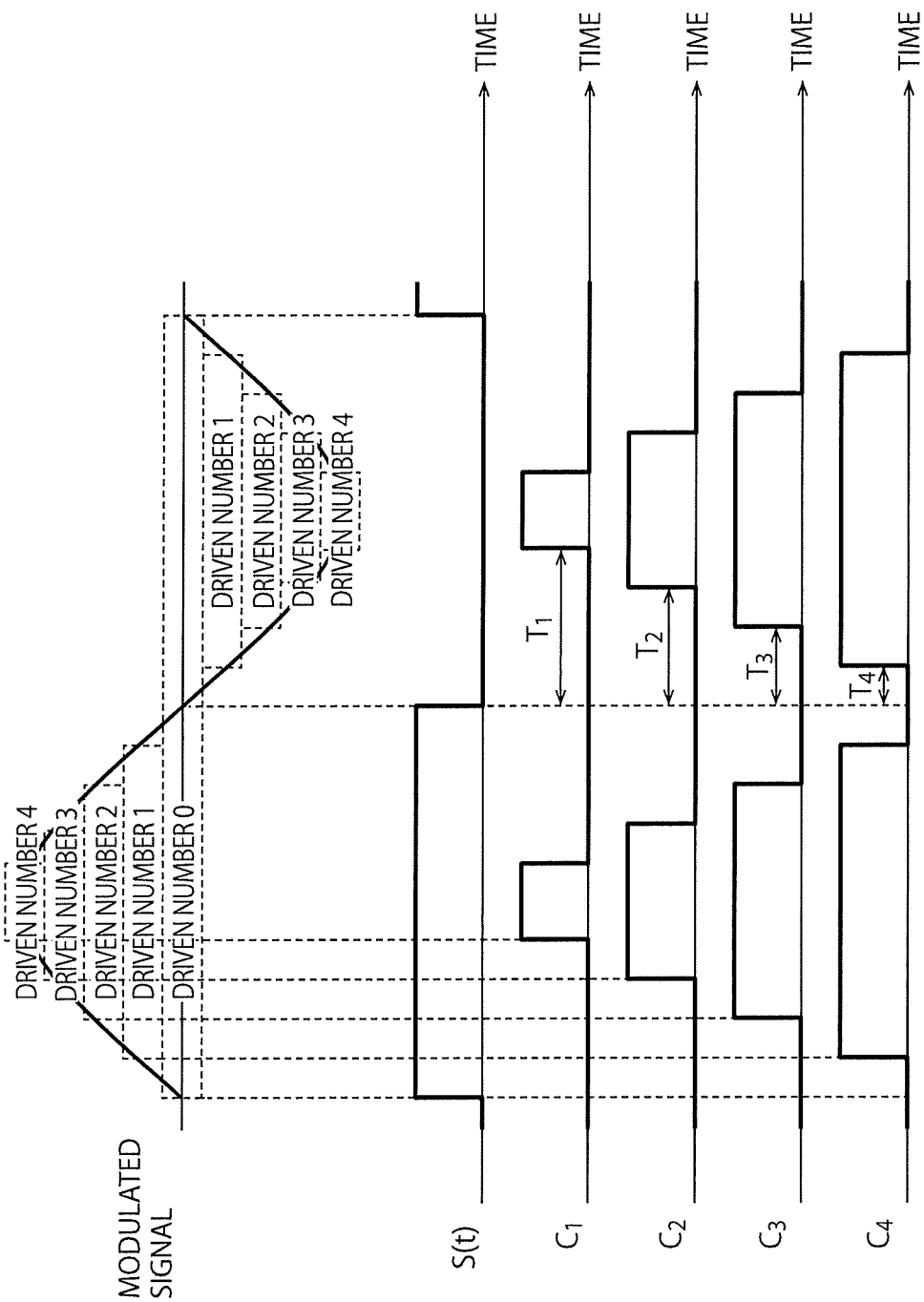
FIG. 9 illustrates generation of a control signal.

Details of generation of the control signal will be described. FIG. 9 illustrates generation of the control signal. In the example of FIG. 9, it is assumed that there are four amplification apparatuses 1 referred to as first to fourth amplification apparatuses and four control signals ($C_1$ to $C_4$) are generated.

First, the control signal generator 23 determines a driven number of switching amplifiers 11 according to an amplitude level of the modulated signal at each time point, and generates control signals for the respective switching amplifiers 11 so that the determined driven number of switching amplifiers 11 are driven. As the amplitude of the modulated signal shown in the upper part of FIG. 9 increases, a necessary driven number of amplification apparatuses 1 increases. The control signal generator 23 then selects amplification apparatuses 1 as many as the determined driven number from the plurality of amplification apparatuses 1. A selection method may be determined as appropriate. The control signal generator 23 sets the values of the control signals for the selected amplification apparatuses 1 to 1, and sets the values of the control signals for the amplification apparatuses 1 not selected to 0. This causes the necessary number of amplification apparatuses 1 to be driven at desired timing. In addition, the control signal generator 23 generates the control signals so that the cycles of the control signals are a half cycle of the rectangular wave carrier signal.

In the example of FIG. 9, the values are changed to 1 in descending order from the control signal $C_4$. When the modulated signal is near 0, none of the switching amplifiers 11 are used, so all the four control signals are 0. When the amplitude increases from 0 and exceeds a first threshold value, the necessary driven number becomes 1, and control signal $C_4$ is set to 1. The other control signals remain at 0. When the amplitude further increases and exceeds a second threshold value, the necessary driven number becomes two, the control signals $C_3$ and $C_4$ are set to 1, and the other control signals remain at 0. In this way, the number of control signals whose value is 1 increases.

As the amplitude reaches a maximum value and then goes down, the number of control signals whose value is 1 also decreases. In addition, when the amplitude decreases from 0 to minus, the used number of switching amplifiers 11 varies in the same manner as when the amplitude is positive.

When the control signals are generated in this way, timings of switching of the rectangular wave carrier signal, which is the signal to be amplified, and the control signal are different as shown in FIG. 9. Therefore, if a conventional amplification apparatus is provided, unintended amplification may occur.

Figure 10:
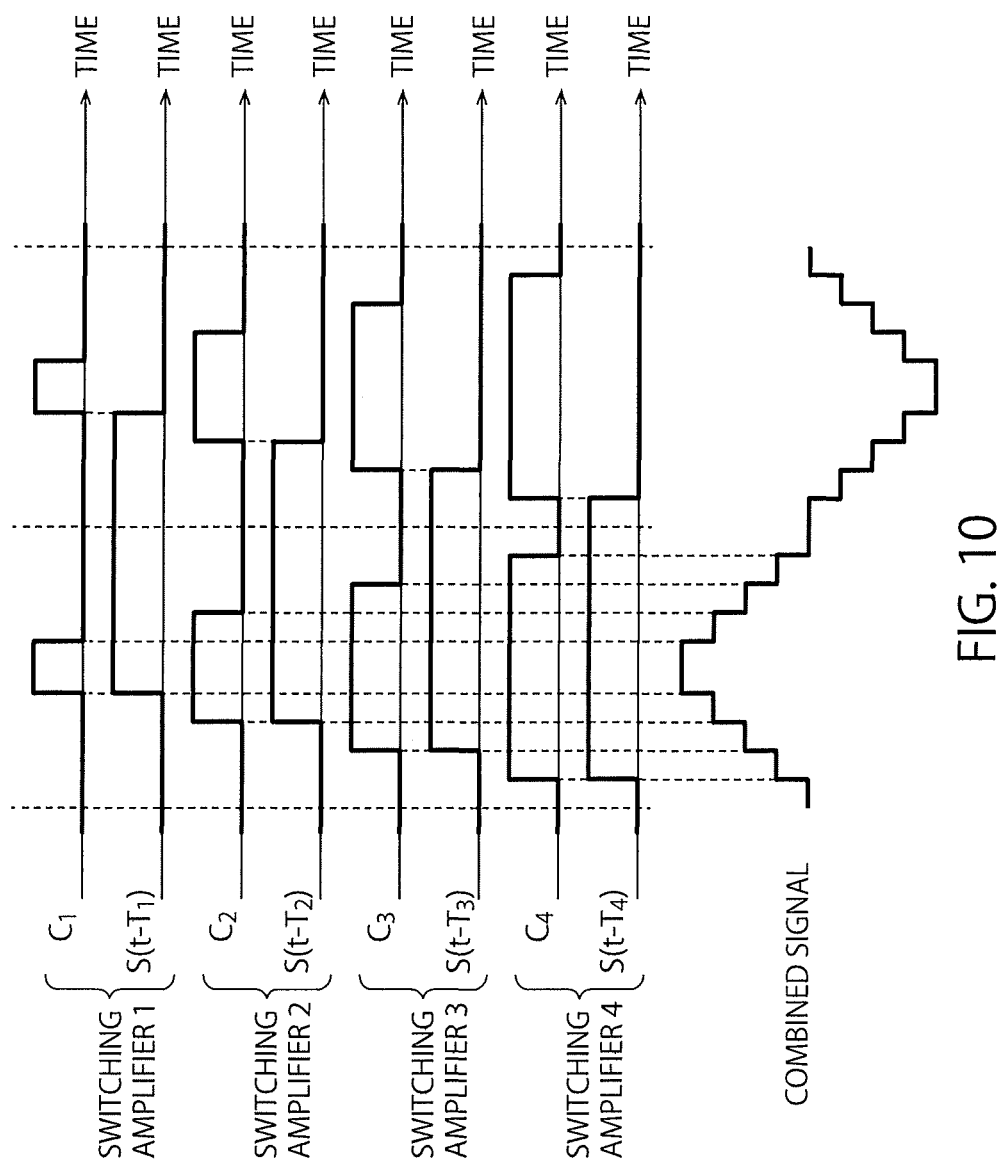
FIG. 10 illustrates an example of a control signal and a rectangular wave carrier signal input into a switching amplifier of the second embodiment.

FIG. 10 illustrates an example of the control signals and the rectangular wave carrier signals input into the switching amplifiers 11 of the second embodiment. As described above, the rectangular wave carrier signal is adjusted for each switching amplifier 11. For example, it is assumed that, with respect to switching time of the rectangular wave carrier signal $S(t)$, the rise of the control signal $C_1$ is delayed by time $T_1$, the control signal $C_2$ is delayed by time $T_2$, the control signal $C_3$ is delayed by time $T_3$, and the control signal $C_4$ is delayed by time $T_4$. In that case, the first amplification apparatus 1 inputs a rectangular wave carrier signal $S(t-T_1)$ delayed by the time $T_1$ with respect to the rectangular wave carrier signal $S(t)$ into the switching amplifier 11. The second amplification apparatus 1 inputs a rectangular wave carrier signal $S(t-T_2)$ delayed by the time $T_2$ with respect to the rectangular wave carrier signal $S(t)$ into the switching amplifier 11. The third amplification apparatus 1 inputs a rectangular wave carrier signal $S(t-T_3)$ delayed by the time $T_3$ with respect to the rectangular wave carrier signal $S(t)$ into the switching amplifier 11. The fourth amplification apparatus 1 inputs a rectangular wave carrier signal $S(t-T_4)$ delayed by the time $T_4$ with respect to the rectangular wave carrier signal $S(t)$ into the switching amplifier 11. This causes the timing of switching of the rectangular wave carrier signal and the timing of rise of the control signal to be coincided with each other for all the switching amplifiers 11. This prevents unintended amplification. In addition, the combined signal is a signal with harmonics suppressed because the combined signal becomes a step shape as shown in the lower part of FIG. 10.

FIG. 11 illustrates another example of the control signal. In FIG. 9, the pulse width of the control signal $C_1$ is much narrower than the pulse width of the control signal $C_4$. In this case, a high response speed is required for the amplification apparatus, leading to an increase in manufacturing cost or the like. In order to avoid this, in the example of FIG. 11, the amplification apparatus 1 stops in the order of driving. In this case, in comparison with FIG. 9, time of fall of the control signal $C_1$ is replaced with time of fall of the control signal $C_4$, and time of fall of the control signal $C_2$ is replaced with time of fall of the control signal $C_3$. Since the number of amplification apparatuses 1 that are on at each time point is the same as in the case of FIG. 9, the combined signal is the same as the combined signal in FIG. 10 as a result.

In the case of aligning the pulse widths of the control signals in this way, the control signal generator 23 generates the control signals by using combinations of a sign of the modulated signal (that is, positive or negative) and a sign of an inclination of the modulated signal (that is, a derivative value). By determining priority of the amplification apparatuses 1 to be used for each of the combinations in advance, it is possible to stop the amplification apparatuses 1 in the order of driving. In this case, the transmission apparatus 2 may include a first determination device determining the sign of the modulated signal, a derivative value calculator calculating the derivative value of the modulated signal, and a second determination device determining the sign of the derivative value, in addition to the control signal generator 23.

As described above, the transmission apparatus 2 of the embodiment includes a plurality of amplification apparatuses 1 of the first embodiment. Although an individual control signal is input into each amplification apparatus 1, each amplification apparatus 1 aligns the timing of rise of the input control signal and the timing of switching of the signal to be amplified. This allows each amplification apparatus 1 to achieve normal amplification operation and generate an expected amplified signal. In addition, the transmission apparatus 2 controls the driving order of each amplification apparatus 1 using the control signal to generate a combined signal with harmonic components suppressed. Since no unintended amplified signals are included, in the combined signal, the harmonic components can be suppressed more accurately than existing apparatuses. This causes requirements of a BPF used in a modulation apparatus to be relaxed, or a BPF to be unnecessary, so that manufacturing cost of the modulation apparatus can be reduced.

Although in the embodiment, the adjuster 12 is included in the amplification apparatus 1, the adjuster 12 may be implemented with an FPGA (Field-Programmable Gate Array). In this case, for example, the waveform converter 21, modulator 22, the control signal generator 23, and the adjuster 12 are implemented in the FPGA, and the FPGA provides the plurality of amplification apparatuses 1 with the rectangular wave carrier signals and the control signals individually delayed within the FPGA.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An amplification apparatus comprising:
   a switching amplifier configured to be driven on the basis of a control signal to amplify a signal to be amplified and to generate an amplified signal; and
   an adjuster configured to adjust at least one of the signal to be amplified and the control signal before being input into the switching amplifier, wherein
   the adjuster aligns timing when the control signal turns from LOW to HIGH and ti when the signal to be amplified turns from LOW to HIGH or the timing when the control signal turns from LOW to HIGH and timing when the signal to be amplified turns from HIGH to LOW.

2. The amplification apparatus according to claim 1, wherein
   the adjuster includes a delay circuit.

3. The amplification apparatus according to claim 1, wherein
   the adjuster includes a D flip-flop,
   the signal to be amplified is received at a D terminal of the D flip-flop, and the control signal is received at a CLK terminal of the D flip-flop.

4. The amplification apparatus according to claim 1, wherein
   the switching amplifier includes a full bridge circuit configured to be driven on the basis of the signal to be amplified and the control signal.

5. The amplification apparatus according to claim 4, wherein the full bridge circuit includes:
   a first high-side transistor;
   a second high-side transistor connected in parallel with the first high-side transistor;
   a first low-side transistor connected in series with the first high-side transistor; and
   a second low-side transistor connected in series with the second high-side transistor and in parallel with the first low-side transistor, wherein
   the first low-side transistor and the second low-side transistor switch on the basis of the control signal.

6. The amplification apparatus according to claim 5, wherein
   the first high-side transistor, the second high-side transistor, the first low-side transistor, and the second low-side transistor include each a transistor having a body diode.

7. The amplification apparatus according to claim 6, wherein
   the first high-side transistor, the second high-side transistor, the first low-side transistor, and the second low-side transistor are each a MOSFET.

8. The amplification apparatus according to claim 4, wherein
   the full bridge circuit further includes a transformer,
   one end of the transformer is connected to a connection point between the first high-side transistor and the first low-side transistor, and
   the other end of the transformer is connected to a connection point between the second high-side transistor and the second low-side transistor.

9. The amplification apparatus according to claim 1, wherein a plurality of the switching amplifiers are provided, and
   the amplification apparatus further comprises a combiner configured to combine amplified signals from the switching amplifiers to generate a combined signal.

10. The amplification apparatus according to claim 9, wherein
    the combiner generates the combined signal by voltage addition.

11. The amplification apparatus according to claim 9, further comprising
    a control signal generator configured to determine a driven number of the switching amplifiers according to an amplitude level of a specified signal and configured to generate control signals of the switching amplifiers to drive the determined driven number of the switching amplifiers.

12. The amplification apparatus according to claim 11, wherein
    the control signal generator generates the control signals, and
    cycles of the control signals are a half cycle of the signal to be amplified.

13. A transmission apparatus comprising:
    a waveform converter configured to convert a waveform of a carrier signal into a rectangular wave;
    a modulator configured to modulate the carrier signal on the basis of a signal to be transmitted including information to be transmitted to generate a modulated signal;
    the amplification apparatus according to claim 11 configured to receive a carrier signal with a waveform converted into a rectangular wave as the signal to be amplified, configured to receive the modulated signal as the specified signal, and configured to output the combined signal; and
    an antenna device configured to transmit the combined signal.

14. A transmission apparatus comprising:
    a switching amplifier configured to be driven on the basis of a control signal to amplify a signal to be amplified and to generate an amplified signal;
    an adjuster configured to adjust at least one of the signal to be amplified and the control signal before being input into the switching amplifier; and
    an antenna device configured to transmit a signal based on the amplified signal, wherein the adjuster aligns timing when the control signal turns from LOW to HIGH and timing when the signal to be amplified turns from LOW to HIGH or the timing when the control signal turns from LOW to HIGH and timing when the signal to be amplified turns from HIGH to LOW.

15. A transmission apparatus comprising:

a first switching amplifier configured to be driven on the basis of a first control signal to amplify a first signal to be amplified and to generate a first amplified signal;

a first adjuster configured to adjust at least one of the first signal to be amplified and the first control signal before being input into the first switching amplifier;

a second switching amplifier configured to be driven on the basis of a second control signal to amplify a second signal to be amplified and to generate a second amplified signal;

a second adjuster configured to adjust at least one of the second signal to be amplified and the second control signal before being input into the second switching amplifier;

a combiner configured to combine the first amplified signal and the second amplified signal to generate a combined signal; and an antenna device configured to transmit the combined signal, wherein:

the first adjuster aligns timing when the first control signal turns from LOW to HIGH and timing when the first signal to be amplified turns from LOW to HIGH or the timing when the first control signal turns from LOW to HIGH and timing when the first signal to be amplified turns from HIGH to LOW; and the second adjuster aligns timing when the second control signal turns from LOW to HIGH and timing when the second signal to be amplified turns from LOW to HIGH or the timing when the second control signal turns from LOW to HIGH and timing when the second signal to be amplified turns from HIGH to LOW.

* * * * *